(12) United States Patent
Pan

(10) Patent No.: US 11,631,778 B2
(45) Date of Patent: Apr. 18, 2023

(54) HIGH-EFFICIENCY TRANSLUCENT SOLAR MODULE ASSEMBLY

(71) Applicant: Wei Pan, Vancouver, WA (US)

(72) Inventor: Wei Pan, Vancouver, WA (US)

(73) Assignee: DWP Energy Solutions LLC, Vancouver, WA (US)

( * ) Notice: Subject to any disclaimer, the term of this patent is extended or adjusted under 35 U.S.C. 154(b) by 65 days.

(21) Appl. No.: 16/419,055

(22) Filed: May 22, 2019

(65) Prior Publication Data

US 2020/0295213 A1 Sep. 17, 2020

Related U.S. Application Data

(60) Provisional application No. 62/711,433, filed on Jul. 27, 2018.

(51) Int. Cl.
*H01L 31/054* (2014.01)
*H01L 31/0475* (2014.01)
(Continued)

(52) U.S. Cl.
CPC ...... *H01L 31/0547* (2014.12); *H01L 31/0475* (2014.12); *H01L 31/0504* (2013.01); *H02S 40/22* (2014.12); *A01G 9/14* (2013.01); *A01G 9/243* (2013.01); *F21V 7/22* (2013.01); *F21V 9/04* (2013.01); *F21V 9/20* (2018.02);
(Continued)

(58) Field of Classification Search
CPC ............. H01L 31/0547; H01L 31/0475; H01L 31/0504; H01L 31/0488; H01L 31/0549; H02S 40/22; A01G 9/14; A01G 9/243; F21V 7/22; F21V 9/04; F21V 9/20; F24S 25/61; G01J 5/0814; G02B 6/29361;
(Continued)

(56) References Cited

U.S. PATENT DOCUMENTS 4,850,134 A 7/1989 Snekkenes
5,994,641 A * 11/1999 Kardauskas .......... H01L 31/048
136/246

(Continued)

FOREIGN PATENT DOCUMENTS

EP 2718989 10/2017
FR 3042353 4/2017
(Continued)

OTHER PUBLICATIONS

Abrisa Technologies "high Performance Thin Film Optical Coatings Technical Capabilities" ZC&R Coatings for Optics, www.abrisatechnologies.com (Year: 2016).*
(Continued)

*Primary Examiner* — Michael Y Sun
(74) *Attorney, Agent, or Firm* — Joseph E. Maenner; Maenner & Associates, LLC

(57) ABSTRACT

A solar module assembly includes a frame having an upper portion encompassing an area and a mid portion disposed below the upper portion. A plurality of solar panels is arranged in a string, sandwiched between two transparent panes forming a single string panel. The solar panels occupy less than the area of the upper portion. Each of the plurality of solar panels has a pair of opposing edges. A reflector is mounted on the mid portion to reflect light selectively.

16 Claims, 3 Drawing Sheets

(51) Int. Cl.

| | | |
|---|---|---|
| *H02S 40/22* | (2014.01) | |
| *H01L 31/05* | (2014.01) | |
| *G01J 5/08* | (2022.01) | |
| *F21V 7/22* | (2018.01) | |
| *A01G 9/24* | (2006.01) | |
| *H01Q 15/00* | (2006.01) | |
| *F24S 25/61* | (2018.01) | |
| *F21V 9/20* | (2018.01) | |
| *F21V 9/04* | (2018.01) | |
| *A01G 9/14* | (2006.01) | |
| *G02B 27/01* | (2006.01) | |
| *G02B 27/14* | (2006.01) | |
| *G02B 6/293* | (2006.01) | |
| *G03B 33/12* | (2006.01) | |

(52) U.S. Cl.
CPC ............. *F24S 25/61* (2018.05); *G01J 5/0814* (2022.01); *G02B 6/29361* (2013.01); *G02B 27/141* (2013.01); *G02B 2027/0114* (2013.01); *G03B 33/12* (2013.01); *H01Q 15/0013* (2013.01)

(58) Field of Classification Search
CPC .......... G02B 27/141; G02B 2027/0114; G03B 33/12; H01Q 15/0013; Y02B 10/10; Y02E 10/52
See application file for complete search history.

(56) References Cited

U.S. PATENT DOCUMENTS

| | | |
|---|---|---|
| 7,227,077 B2 | 6/2007 | Kleinwaechter |
| 8,418,401 B2 | 4/2013 | Chuang et al. |
| 8,915,015 B1 | 12/2014 | Augspurger |
| 9,509,247 B1 | 11/2016 | Hinson |
| 2007/0137690 A1 | 6/2007 | Bruning et al. |
| 2007/0202155 A1 | 7/2007 | Iwai |
| 2011/0005128 A1* | 1/2011 | Chuang .................. F24S 20/67 47/17 |
| 2011/0277819 A1* | 11/2011 | Scheulov .............. H01L 31/046 136/246 |
| 2012/0152307 A1 | 6/2012 | MacGregor et al. |
| 2012/0198763 A1* | 8/2012 | Chuang ............. H01L 31/02167 47/17 |
| 2013/0220401 A1* | 8/2013 | Scheulov ........... H01L 31/0525 136/246 |
| 2014/0209167 A1* | 7/2014 | Yamada ................ H01L 31/048 136/257 |
| 2017/0202155 A1* | 7/2017 | Iwai ....................... A01G 7/045 |

FOREIGN PATENT DOCUMENTS

| | | | |
|---|---|---|---|
| WO | WO-2012167865 A1 * | 12/2012 | ............. C09D 5/004 |
| WO | WO2013/130448 | 9/2013 | |

OTHER PUBLICATIONS

European Search Report for European Application 19183898.6. dated Dec. 17, 2019.

T. J. Hebrink (2012). Durable Polymeric Films for Increasing the Performance of Concentrators, Third Generation Photovoltaics, Dr. Vasilis Fthenakis (Ed.), ISBN: 978-953-51-0304-2, InTech, Available from: http://www.intechopen.com/books/third-generation-photovoltaics/durable-polymeric-films-for-increasing-theperformance-of-concentrators.

European Communication for European Application 19183898.6. dated Jan. 27, 2021.

* cited by examiner

HIGH-EFFICIENCY TRANSLUCENT SOLAR MODULE ASSEMBLY

CROSS-REFERENCE TO RELATED APPLICATIONS

The present application claims priority from U.S. Provisional Patent Application Ser. No. 62/711,433, filed on Jul. 27, 2018, which is incorporated herein by reference in its entirety.

BACKGROUND OF THE INVENTION

Field of the Invention

The present invention is directed to high-efficiency solar panels, particularly for installation on building or greenhouse roofs.

Prior Art

Solar irradiation collecting and converting devices, designed to collect as much light as possible, appear dark and impervious, casting dark shadows underneath. They are usually placed in the open field far from buildings or inner-city areas where sun shine is necessary. Recently, the concept of distributed solar collection and electricity generation has been adopted worldwide, the installation of building integrated photovoltaic (PV) devices is on the rise.

Besides roof-top installation of solar panels, semi-transparent or translucent solar panels integrated onto the outer surface of a building structure are seen everywhere. Very thin amorphous silicon, dye-sensitized solar panels, and organic PV transmits a portion of visible (VIS) as well as infrared lights (IR) through the panel, only collects small portion of UV-blue, VIS, and IR light for electricity generation. Although the conversion efficiency is quite low, those panels usually don't obstruct aesthetic views through them. Thus, they are suitable for window application.

The view through those transparent panels are not distorted, but their low power conversion efficiency impacts on the overall economic benefits to install them. Unlike window tint films which reject both UV and IR light for energy efficient buildings, transparent PV panels do not block IR light. This type of window panel can't qualify as low-e window. During summer time, extra energy is needed to cool interior because of IR radiation from exterior; while during winter time, extra heating is needed to heat interior because of loss due to IR radiation from interior.

Luminescent solar concentrator is another interesting technology and is currently under developing. It incorporates a luminescent interlayer to convert sunlight into, mainly, red light. The red light emitted from the luminescent material can be readily used by the plants for photosynthesis. However, blue and green lights also play an important role in plant growth. Furthermore, due to the fact that IR has lower energy than the emitted red light, they simply cannot be effectively utilized by this technology.

To maintain partial transparency but improve light to electricity conversion efficiency, a sacrifice to the aesthetic view may be required. There is a practice to make a partial transparent panel with impervious Si wafers placed in a pattern that keeps a gap between wafers. Areas covered with Si wafer can collect and convert light into electricity at a higher efficiency, while the gap between wafers can pass light to shine interior. This type of semi-transparent panel has been integrated with large structures, like sports arena, transportation stations. The partially filled Si panel blocks certain percentage of light (for example 50% to 80%) and convert that light to electricity. The opening area (gaps) can also provide interior illumination. Of course, the aesthetic view of such a panel is not great as compared to uniformly transparent panels because the panel casts spotted shadows.

One of the applications of transparent and semi-transparent panels is for greenhouses where the aesthetic view does not matter. Greenhouses with glass roof and sides and can be replaced by those panels to allow partial light penetration while converting the remaining portion into electricity. Indoor growing in the US is increasing in recent years. Vertical growing with LED light for leafy vegetables or large greenhouses for large plants is getting popular. With transparent or semi-transparent PV roof or sides, the greenhouse can generate electricity to compensate power consumption.

It would be beneficial to provide a solar panel that allows for increased conversion of photovoltaic light to electricity, while still allowing sufficient light to pass through to a location beneath the panel to illuminate that area.

BRIEF SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, the present invention is a solar module assembly comprising a frame having an upper portion encompassing an area and a mid portion disposed below the upper portion. A plurality of solar panels is arranged in a string, sandwiched between two transparent panes forming a single string panel. The solar panels occupy less than the area of the upper portion. Each of the plurality of solar panels has a pair of opposing edges. A reflector is mounted on the mid portion.

In another embodiment, the present invention provides a solar module assembly comprising a solar panel containing a plurality of spaced apart solar cell strings. Each solar cell string has a top surface, an opposing bottom surface, and a pair of opposed edges. A reflector is disposed below each solar cell string and is configured to reflect light from around the opposing edges onto the bottom surface of each solar cell string.

In yet another embodiment, the present invention provides a solar module assembly comprising a frame having a planar area and a solar panel mounted to the frame. The panel comprises a plurality of cells arranged in solar cell strings. The solar panel has a top surface and a bottom surface. The solar cell strings cover only a portion of the planar area. A reflector is attached to the frame below the solar panel. The reflector is configured to reflect light onto the bottom surface of the solar panel.

BRIEF DESCRIPTION OF THE DRAWINGS

The accompanying drawings, which are incorporated herein and constitute part of this specification, illustrate the presently preferred embodiments of the invention, and, together with the general description given above and the detailed description given below, serve to explain the features of the invention. In the drawings.

DETAILED DESCRIPTION OF THE INVENTION

Figure 1:
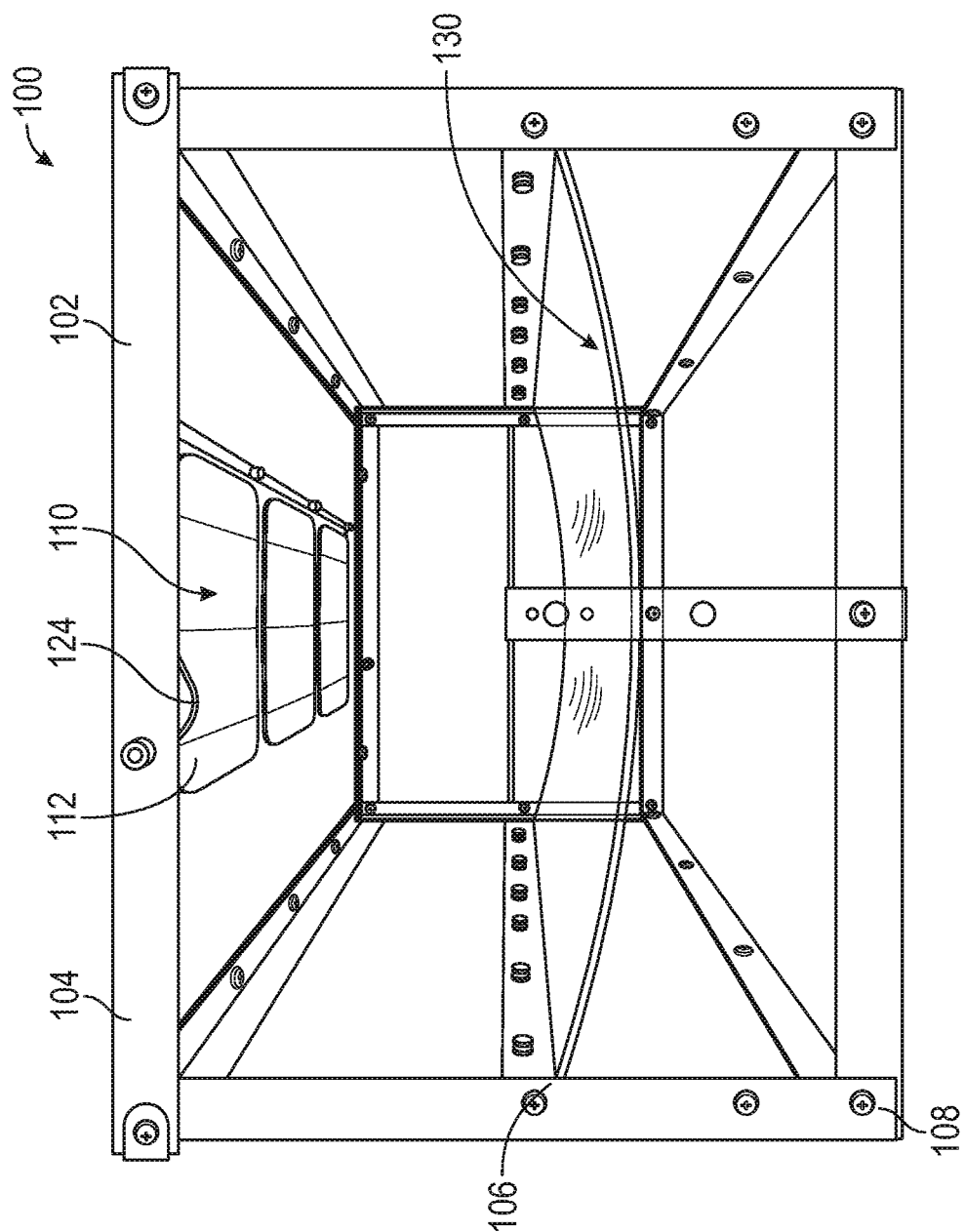
FIG. 1 is a perspective view of a solar module assembly according to an exemplary embodiment of the present invention.

In the drawings, like numerals indicate like elements throughout. Certain terminology is used herein for convenience only and is not to be taken as a limitation on the present invention. The terminology includes the words specifically mentioned, derivatives thereof and words of similar import. The embodiments illustrated below are not intended to be exhaustive or to limit the invention to the precise form disclosed. These embodiments are chosen and described to best explain the principle of the invention and its application and practical use and to enable others skilled in the art to best utilize the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

The present invention is a high-efficiency solar module assembly that can be mounted on the top of a greenhouse roof such that some incident light impacts a top surface of the assembly, other incident light passes through the assembly and is reflected onto a bottom surface of the assembly by a reflector, and remaining incident light passes through the assembly and to and into the greenhouse. While the inventive solar module assembly can be mounted on a greenhouse, those skilled in the art will recognize that the inventive assembly does not necessarily need to be mounted on a greenhouse. By way of example only, the inventive solar module assembly can alternatively be mounted directly on the ground, thereby reducing the impact of the solar module assembly on the local environment by increasing the electrical power generated without increasing the size of the footprint required to generate that electricity.

Figure 2:
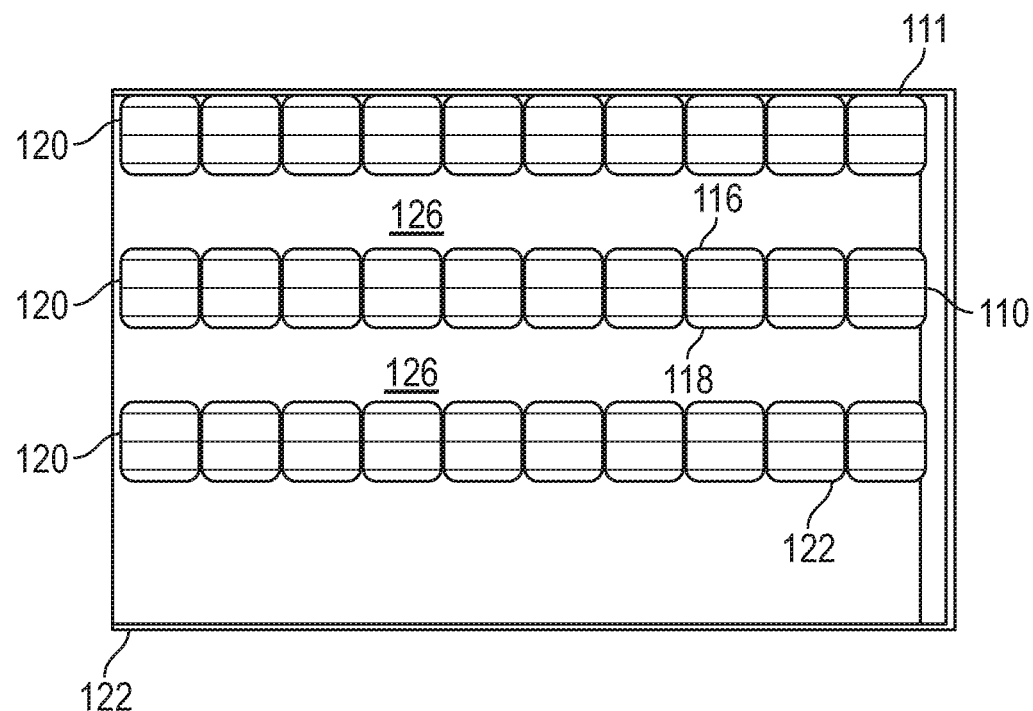
FIG. 2 is a top plan view of a solar panel used with the assembly of FIG. 1.

Referring to the Figures, a solar module assembly 100 ("assembly 100") is shown. Assembly 100 includes a frame 102 having an upper portion 104 that is used to mount a plurality of solar panels 110 thereon (only one panel 110 shown in FIG. 1). Upper portion 104 encompasses a planar area, as shown in FIG. 2.

Frame 102 also includes a mid portion 106 that is disposed below the upper portion 102. Mid portion 106 is used to support a reflector 130.

Optionally, frame 102 can also include a lower portion 108 disposed below mid portion 106. Lower portion 108 is used to raise reflector 130 above a surface, such as a greenhouse roof, ground, or some other surface on which assembly 100 is mounted.

Each of solar panels 110 includes bi-facial photovoltaic silicon cells having a top surface 111 and a bottom surface 112 that each comprises a photovoltaic panel configured to receive light energy, thereby increasing the amount of light energy that can be absorbed as compared to mono-facial photovoltaic cells.

Figure 3:
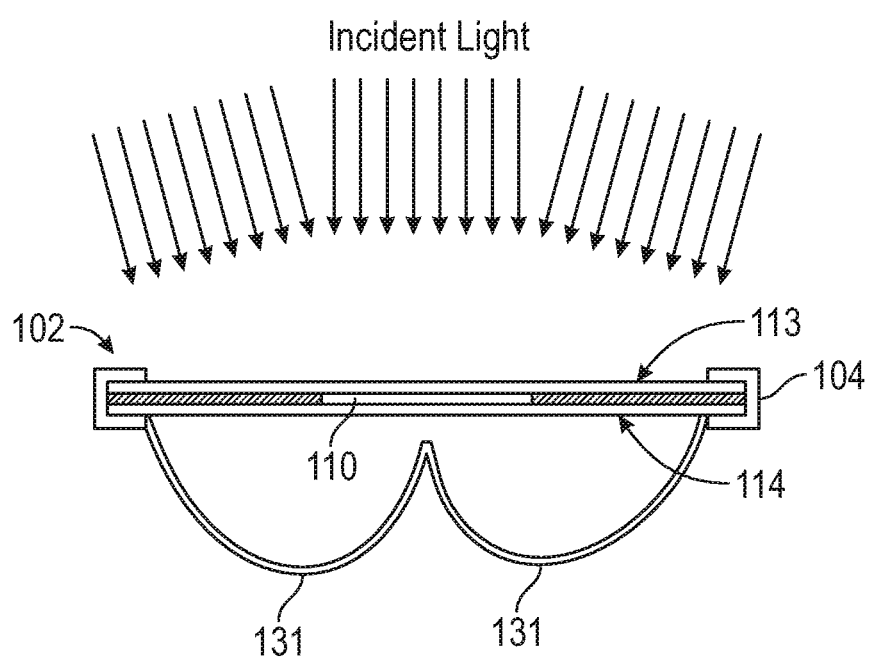
FIG. 3 is a schematic view of a solar module assembly according to an alternative exemplary embodiment of the present invention.

Referring to FIG. 3, panels 110 are arranged in a string and are sandwiched between two transparent panes 113, 114 on the upper portion 104 of frame 102, thereby forming a single string panel having a pair of opposing edges 116, 118. The solar panels 110 occupy less than the area of the upper portion 104 such that some incident light can pass through an unoccupied area of the upper portion 104. As shown in FIG. 2, a plurality of spaced apart solar cell strings 120 are provided on panel 110. Solar cell strings 120 each have a top surface 122 and a bottom surface 124.

Adjacent solar cell strings 120 are spaced apart such that solar cell strings only covering only a portion of the planar area of panel 110, with a gap 126 provided between a first of the solar cell strings 120 and a second of the solar cell strings 120 such that an area between each solar cell string 120 and one of the opposed edges 116, 118 is devoid of solar cell strings so that incident sunlight can pass through the area to reflector 130. In an exemplary embodiment, solar cell strings 120 can be arranged in a striped pattern as shown in FIG. 2. Alternatively, solar cell strings 120 can be arranged in a checkerboard pattern, or any other pattern as desired.

In an exemplary embodiment, solar cell strings 120 cover about 50% of the area of frame 102, while a remaining 50% is devoid of solar cell strings 120 so that light passing between panels 120 can be reflected onto bottom surface 124 of solar cell strings 120. In an exemplary embodiment, with a 50%-50% split as described, and with a 20% conversion efficiency of a silicon panel, about 100 W/m² can be converted from light hitting top surface 122 of solar cell strings 120 and about 40 W/m² can be converted from light hitting bottom surface 124 of solar cell strings 120. Those skilled in the art, however, will recognize that the 50%-50% split can be altered as desired. Alternatively, using Equation 1 below, the amount of power that can be converted from light hitting the bottom surface 124 of solar cell strings 120 can be calculated as:

$$\text{Total Power, } P_T\left(\frac{W}{m^2}\right) = \text{Power from Front,}$$

$$P_F\left(\frac{W}{m^2}\right) + \text{Power from Back, } P_B\left(\frac{W}{m^2}\right)$$

-continued $$P_F\left(\frac{W}{m^2}\right) = $$
$$\text{(Sum of Photons} < 1100 \text{ nm)} * (1 - L_O) * f * EQE * q * Voc * FF$$

$$P_B\left(\frac{W}{m^2}\right) = \text{(Sum of Photons } 700 - 1100 \text{ nm)} *$$
$$(1 - L_R - L_O) * (1 - f) * EQE * q * Voc * BF * FF$$

Where, $L_O$ is the optical loss from air-glass interface, mostly reflective loss;

f is the fraction of area covered by PV panel in the unit area. Thus, 1-f denotes the open area;

EQE stands for external quantum efficiency, which describes the ability of converting photons into electron-hole pair of a PV material;

q is the electron charge, equals to 1.6E-19 Coulomb;

Voc is the open circuit voltage of a PV panel;

FF is the panel fill factor, describes resistive losses of a PV panel;

$L_R$ is the optical loss associated with the reflector, such as reflective loss, optical errors induced loss, etc.; and BF is the bifaciality factor of a bi-facial cell, it describes the differences of conversion efficiency between the front side and the backside of a PV panel.

Reflector 130 is mounted on the mid portion of frame 102 below panels 110 and is configured to reflect light selectively passing through the upper area devoid of the plurality of solar panels 110 onto the bottom surface 112 of the solar panels 110. While a single reflector 130 that spans the width of frame 102 is shown in FIG. 1, those skilled in the art will recognize that a plurality of smaller reflectors 131 can be mounted adjacent to each other to reflect or pass light through reflectors 131, as shown in FIG. 3. Reflectors 131 can be identical to each other or, alternatively, reflectors 131 can have different shapes from other reflectors 131 so that the different shapes can be used to better reflect incident solar light as a function of the motion of the sun around assembly 100.

Reflector 130 is disposed below each solar cell string 120 and is configured to reflect light from around the opposing edges 116, 118 that passes between adjacent solar panels 110 onto the bottom surface 124 of each solar cell string 120.

Reflector 130 is configured to reflect light having a selective, or tunable, wavelength band between about 700 nanometers ("nm") and about 1100 nm and to allow light having a wavelength less than about 700 nm to pass through the reflector 130. The reflected band, between 700 nm and 1100 nm, that would otherwise enter the interior without reflector 130, can be used to convert into electricity to improve solar cell efficiency.

Figure 4:
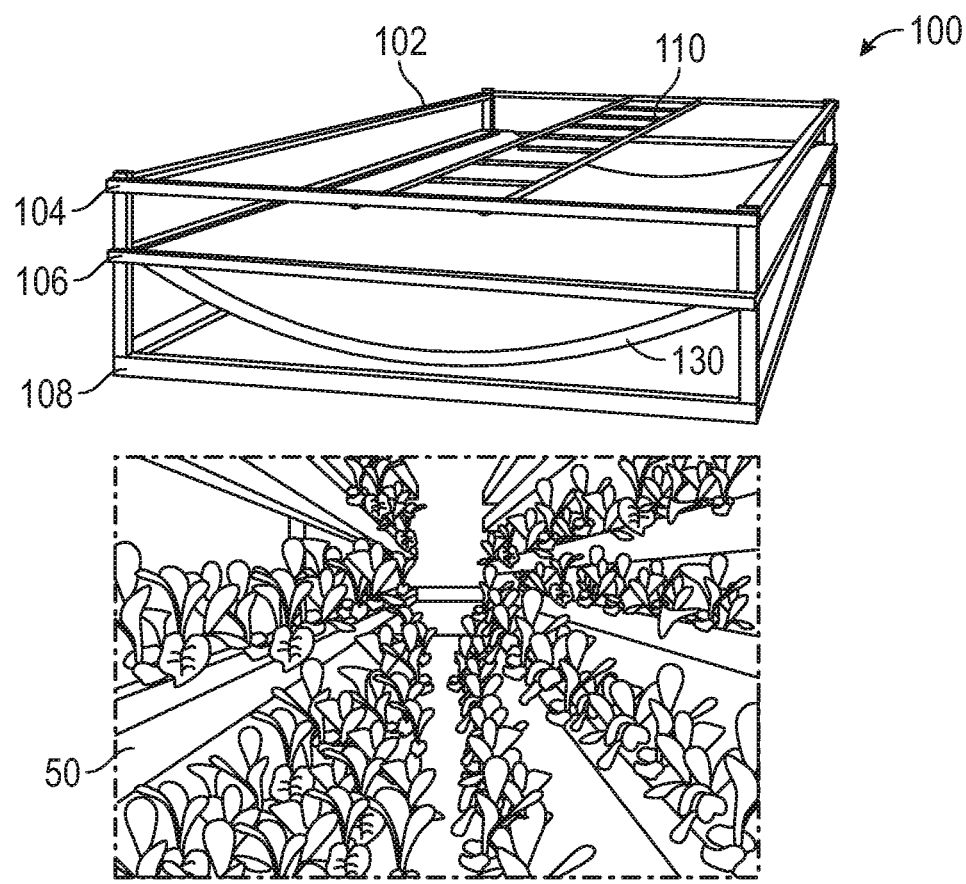
FIG. 4 is a perspective view of the assembly of FIG. 1 mounted on a greenhouse roof.

Reflector 130 can be tunable by selectively applying or coating dichroic layers on reflector 130. The tunability of reflector 130 can be adjusted by removing an existing dichroic layer on reflector 130 and applying a different dichroic layer When assembly 100 is mounted on a greenhouse 50, as shown in FIG. 4, visible light (400 nm to 700 nm) passes through reflector 130 and reaches growing plants inside the greenhouse 50 for the plants to engage in photosynthesis, as well as to illuminate the interior of the greenhouse 50. The light within the 700 nm and 1100 nm range that is reflected back to solar panels 110 is not used by plants and is instead used to generate electricity.

Figure 5:
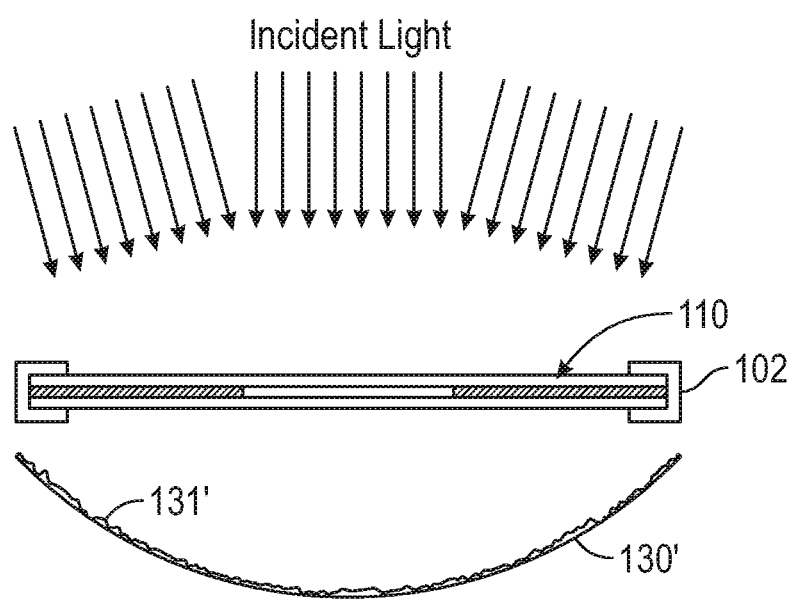
FIG. 5 is a schematic view of a solar module assembly according to another alternative exemplary embodiment of the present invention.

In an exemplary embodiment, as shown in FIG. 1, reflector 130 has an arcuate cross section, while in an alternative exemplary embodiment, shown in FIG. 5, a reflector 130' has a textured surface 131' that is configured to diffuse the visible light. Other configurations of reflector 130, although not shown, can be hyperbolic, arcuate, or elliptical. Additionally, reflector 130 can be a retro-reflector, a flat diffuser, or other shape that can reflect at least a portion of light incident thereon onto bottom surface 124 of solar cell strings 120.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A solar module assembly comprising:
    a frame having:
        an upper portion encompassing an area;
        a mid portion disposed directly below the upper portion, the mid portion encompassing the area; and
        a lower portion configured to attach to a greenhouse roof,
    a plurality of solar panels comprises a plurality of solar cells arranged in a string and supported by the upper portion, the string being sandwiched between two transparent panes forming a single string panel, wherein the solar panels occupy less than the area of the upper portion, each of the plurality of solar panels having a pair of opposing edges;
    and
    a dichroic reflector mounted on the mid portion, the dichroic reflector being directly below the solar panels and encompassing the area,
    wherein the dichroic reflector is configured to reflect incident light having a wavelength band between 700 nanometers and 1100 nanometers, and wherein the dichroic reflector is further configured to allow remaining incident light having a wavelength shorter than 700 nanometers and greater than 1100 nanometers to pass through the dichroic reflector, and
    wherein a first vertical gap is provided between the upper portion and the mid portion and a second vertical gap is provided between the mid portion and the lower portion, such that incident sunlight passing around each of the plurality of solar panels passes through the first vertical gap prior to encountering the dichroic reflector and such that the incident sunlight that passes through the dichroic reflector passes through the second vertical gap.

2. The solar module assembly according to claim 1, wherein the plurality of solar cells has a top surface configured to receive light energy and a bottom surface configured to receive light energy.

3. The solar module assembly according to claim 2, wherein the dichroic reflector is configured to selectively reflect light onto the bottom surface of the solar cells.

4. The solar module assembly according to claim 1, wherein the dichroic reflector has an arcuate cross section.

5. The solar module assembly according to claim 1, wherein the dichroic reflector has a textured surface.

6. The solar module assembly according to claim 2, wherein the upper portion has an upper area devoid of the plurality of solar cells on opposing edges of the solar cells.

7. The solar module assembly according to claim 6, wherein the dichroic reflector is configured to reflect light passing through the upper area devoid of the plurality of solar cells to the bottom surface of the solar cells.

8. A solar module assembly comprising:
a frame having:
  an upper portion encompassing an area;
  a mid portion disposed directly below the upper portion, the mid portion encompassing the area, with a first vertical gap provided between the upper portion and the mid portion; and
  a lower portion disposed directly below the mid portion, with a second vertical gap provided between the mid portion and the lower portion, the lower portion encompassing the area,
a plurality of solar panels arranged in a string, sandwiched between two transparent panes forming a single string panel supported by the upper portion, wherein the solar panels occupy less than the area of the upper portion, each of the plurality of solar panels having a pair of opposing edges;
and
a dichroic reflector mounted on the mid portion, the dichroic reflector being directly below the upper portion and encompassing the area, wherein the dichroic reflector is configured to reflect incident light having a wavelength band between 700 nanometers and 1100 nanometers, and wherein the dichroic reflector is further configured to allow incident light having a wavelength shorter than 700 nanometers and greater than 1100 nanometers to pass through the reflector, and
wherein the lower portion is configured to be attached to a greenhouse roof.

9. A solar module assembly comprising:
a frame having a top portion, a mid portion vertically spaced directly below the top portion with a first vertical gap between the top portion and the mid portion, and a bottom portion, vertically spaced directly below the mid portion, with a second vertical gap between the mid portion and the bottom portion;
a solar panel mounted on the top portion, the solar panel containing a plurality of spaced apart solar cell strings, each solar cell string having a top surface, an opposing bottom surface, and a pair of opposing edges; and
a dichroic reflector disposed below each solar cell string and mounted on the mid portion, the dichroic reflector being configured to reflect light from around the opposing edges onto the bottom surface of each solar cell string,
wherein the bottom portion of the frame is configured for mounting on a greenhouse roof such that the dichroic reflector reflects light having a wavelength between 700 and 1100 nanometers onto the opposing bottom surface and allow light having a wavelength of less than 700 nanometers and greater than 1100 nanometers to pass through the dichroic reflector to the greenhouse roof.

10. The solar module assembly according to claim 9, wherein the dichroic reflector has an arcuate cross section.

11. The solar module assembly according to claim 9, wherein the dichroic reflector has a textured surface.

12. The solar module assembly according to claim 9, wherein the solar panel is mounted on the frame, wherein an area between each solar cell string and one of the opposing edges is devoid of solar cell strings.

13. The solar module assembly according to claim 12, wherein the dichroic reflector is mounted on the frame below the solar panel.

14. A solar module assembly comprising:
a frame having a planar area;
a solar panel mounted to the frame wherein the solar panel comprises a plurality of cells arranged in solar cell strings, the solar panel having a top surface and a bottom surface, the solar cell strings covering only a portion of the planar area; and
a dichroic reflector attached to the frame below the solar panel, the dichroic reflector having the planar area, the dichroic reflector configured to reflect light onto the bottom surface of the solar panel, wherein the dichroic reflector allows light between 400-700 nanometers and greater than 1100 nanometers to pass through the dichroic reflector,
wherein the dichroic reflector is mounted on the frame such that the frame is configured to be attached to a greenhouse roof such that the dichroic reflector is above the greenhouse roof and a vertical gap is provided between the dichroic reflector and the greenhouse roof.

15. The solar module assembly according to claim 14, wherein each of the top surface and the bottom surface comprises a photovoltaic panel.

16. The solar module assembly according to claim 14, wherein a gap is provided between a first of the solar cell strings and a second of the solar cell strings.

* * * * *

UNITED STATES PATENT AND TRADEMARK OFFICE
CERTIFICATE OF CORRECTION

| | | |
|---|---|---|
| PATENT NO. | : 11,631,778 B2 | Page 1 of 1 |
| APPLICATION NO. | : 16/419055 | |
| DATED | : April 18, 2023 | |
| INVENTOR(S) | : Wei Pan | |

It is certified that error appears in the above-identified patent and that said Letters Patent is hereby corrected as shown below:

In the Specification

Column 1, Line 11, before Background of the Invention, please add:
STATEMENT OF GOVERNMENT INTEREST
This invention was made with Government support under DE-AR0000839 award by U.S. Department of Energy. The Government has certain rights in this invention.

Signed and Sealed this
Ninth Day of July, 2024

Katherine Kelly Vidal
*Director of the United States Patent and Trademark Office*